United States Patent [19]
Francis

[11] Patent Number: 6,128,194
[45] Date of Patent: Oct. 3, 2000

[54] PC CARD WITH ELECTROMAGNETIC AND THERMAL MANAGEMENT

[75] Inventor: Dexter Francis, Salt Lake City, Utah

[73] Assignee: 3Com Corporation, Santa Clara, Calif.

[21] Appl. No.: 08/906,026

[22] Filed: Aug. 5, 1997

[51] Int. Cl.[7] .................................................. H05K 7/14
[52] U.S. Cl. .......................... 361/737; 361/736; 361/752; 361/801; 235/492; 439/946
[58] Field of Search .................... 361/728, 736, 361/737, 704, 709, 688, 719, 752, 796, 799, 800, 801, 816, 818; 257/679; 235/492; 439/946; 174/35 R, 51, 15.1

[56] References Cited

U.S. PATENT DOCUMENTS

| | | | |
|---|---|---|---|
| 4,029,999 | 6/1977 | Neumann et al. | 361/704 |
| 5,339,222 | 8/1994 | Simmons et al. | 361/818 |
| 5,403,973 | 4/1995 | Santilli et al. | 174/15.1 |
| 5,475,919 | 12/1995 | Wu et al. | 29/841 |
| 5,476,387 | 12/1995 | Ramey et al. | 439/76.1 |
| 5,477,426 | 12/1995 | Bethurum | 361/737 |
| 5,530,622 | 6/1996 | Takiar et al. | 361/737 |
| 5,548,483 | 8/1996 | Feldman | 361/737 |
| 5,563,769 | 10/1996 | MacGregor | 361/737 |
| 5,563,770 | 10/1996 | Bethurum | 361/737 |
| 5,574,628 | 11/1996 | Persia et al. | 361/737 |
| 5,590,028 | 12/1996 | Duncan | 361/737 |
| 5,838,542 | 11/1998 | Nelson et al. | 361/704 |

*Primary Examiner*—Jayprakash N. Gandhi
*Attorney, Agent, or Firm*—Workman, Nydegger & Seeley

[57] ABSTRACT

A PC card includes a circuit board having an electrical component mounted on the face thereof and an I/O connector coupled to an end thereof. The circuit board is enclosed by a metal casing. The casing includes a top cover having a pair of sidewalls projecting from the sides thereof. Each top sidewall has an outside face with an engagement shelf projecting therefrom. The base cover includes a pair of bottom sidewall projecting at opposing sides thereof. Each of the bottom sidewalls has an inside face with an engagement ridge projecting therefrom. The bottom sidewalls are configured such that the locking ridges engage the shelf when the top cover and base cover are pressed together with the circuit board positioned therebetween. Projecting from the inside face of the top cover is a shield wall encircling a heat sink. The shield wall encircles the component on the circuit board when the top and base cover are attached together.

22 Claims, 5 Drawing Sheets

PC CARD WITH ELECTROMAGNETIC AND THERMAL MANAGEMENT

BACKGROUND OF THE INVENTION

1. The Field of the Invention

The present invention relates to PC cards, and more specifically, PC cards for controlling electromagnetic interference and thermal dissipation.

2. The Relevant Technology

PC cards are small, thin card-like structures that house a circuit board. Most PC cards are configured to comply with standards defined by the Personal Computer Memory Card International Association (PCMCIA). During use, the PC card is selectively inserted into a small aperture constructed in a personal computer or other electronic equipment. The circuit board of the PC card can be constructed to perform a variety of different functions. Most commonly, PC cards are used for either storing memory or for facilitating communication links over standard or wireless systems.

A conventional PC card comprises a circuit board having an input/output (I/O) connector attached at one end thereof. Mounted around the remaining perimeter of the circuit board is a plastic frame. A casing attaches to the frame to enclose the circuit board. The casing includes a stamped metal top plate that is secured by an adhesive to the frame over the top of the circuit board. A stamped metal bottom plate is likewise secured by an adhesive to the frame over the bottom of the circuit board.

Although PC cards are used extensively, they have several shortcomings. For example, electromagnetic interference can emanate from the circuit board and interfere with other electrical components within the computer. To help eliminate this interference, it is desirable to ground the PC card. The top and bottom metal cover plates, however, are separated by the plastic frame and adhesive which are non-conductive. Accordingly, supplemental connectors extending between the top plate and the bottom plate are required to enable complete grounding of the PC card. Even in this configuration, however, leaking can occur between the connectors.

Use of an adhesive in assembling the PC card results in yet other problems. Most notably, adhesives are both awkward and hazardous to work with. Furthermore, by using adhesives, the top and bottom plates of the casing must be exactly positioned and held in place until the adhesive cures. Likewise, as a result of using the adhesive, it is difficult if not impossible to remove the cover for repairing or modifying the circuit card without damaging the PC card.

An additional problem or limitation associated with conventional PC cards is heat dissipation. That is, to meet standardized size specifications, casings on most PC cards are formed from stamped sheet metal of a relatively thin thickness. As the demand and capabilities on PC cards increase, however, the components on the circuit board require increasing amounts of power. In turn, this increase in power consumption generates relatively high temperatures within the PC card. These elevated temperatures can damage or hamper the operation of the PC card.

An additional problem with conventional PC cards is electromagnetic interference between components on circuit board. Such interference can affect the operation of the PC card.

OBJECTS AND BRIEF SUMMARY OF THE INVENTION

Accordingly, it is an object of the present invention to provide improved PC cards.

Another object of the present invention is to provide improved PC cards that can be assembled without the use of an adhesive.

Another object of the present invention is to provide improved PC cards that can be repeatedly assembled and disassembled.

Yet another object of the present invention is to provide improved PC cards that are easily grounded without the addition of supplemental connectors.

Also another object of the present invention is to provide improved PC cards that effectively dissipate heat from the circuit board.

Another object of the present invention to provide improved PC cards that minimize electromagnetic interference between the PC card and electronic apparatus which the PC card is coupled.

Finally, it is another object of the present invention to provide improved PC cards that minimize electromagnetic interference between components on the circuit board within the PC card.

To achieve the foregoing objects, and in accordance with the invention as embodied and broadly described herein, a PC card is provided. The PC card comprises a circuit board having a top surface and an opposing bottom surface. Mounted on the top surface are a plurality of discreet electronic components. Attached at one end of the circuit board is an I/O connector.

The PC card further includes a metallic top cover and base cover. The top cover comprises a substantially rectangular plate having opposing end walls and opposing top sidewalls. Each top sidewall has an outside face with an engagement shelf extending therefrom along the length of the top cover.

The metallic base cover comprises a substantially rectangular plate having bottom sidewalls upstanding therefrom. Each base sidewall has an inside face with a locking ridge that projects inwardly along the length of the base cover. The base sidewalls are configured such that as the top cover and base cover are pressed together, with the circuit board therebetween, the locking ridge snaps over the engagement shelf, thereby mechanically locking the top cover to the base cover. This mechanical connection enables selective assembly and disassembly of the PC card without risk of damaging the PC card. Furthermore, since both the top cover and bottom cover are metal, this mechanical attachment also acts as an electrical coupling between the top and bottom cover. A single attachment to the PC card can thus be used to ground the complete PC card. In addition, since the mechanical connection is constant along each side of the PC card, leaking of electromagnetic interference from the PC card is minimized.

The top cover also has an inside surface that is positioned over the top surface of the circuit board. Projecting down from the inside surface of the top cover is a shield. The shield is configured to encircle a desired component on the circuit board when the top cover and base cover are locked together. The shield captures the electromagnetic interference from the component which is then conducted to the top cover and then to ground. As a result, the electromagnetic interference between discrete components is minimized.

Also projecting from the inside surface of the top cover is a heat sink. The heat sink is positioned within the shield and can be configured to contact the component when the top cover and base cover are locked together. The heat sink conducts away heat from the component so as to maintain operation of the circuit board at relatively low temperatures.

In the preferred embodiment, the top cover, including the heat sink and shield, are integrally die cast in aluminum. The aluminum increases the thermal conductivity of the top cover.

These and other objects, features, and advantages of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
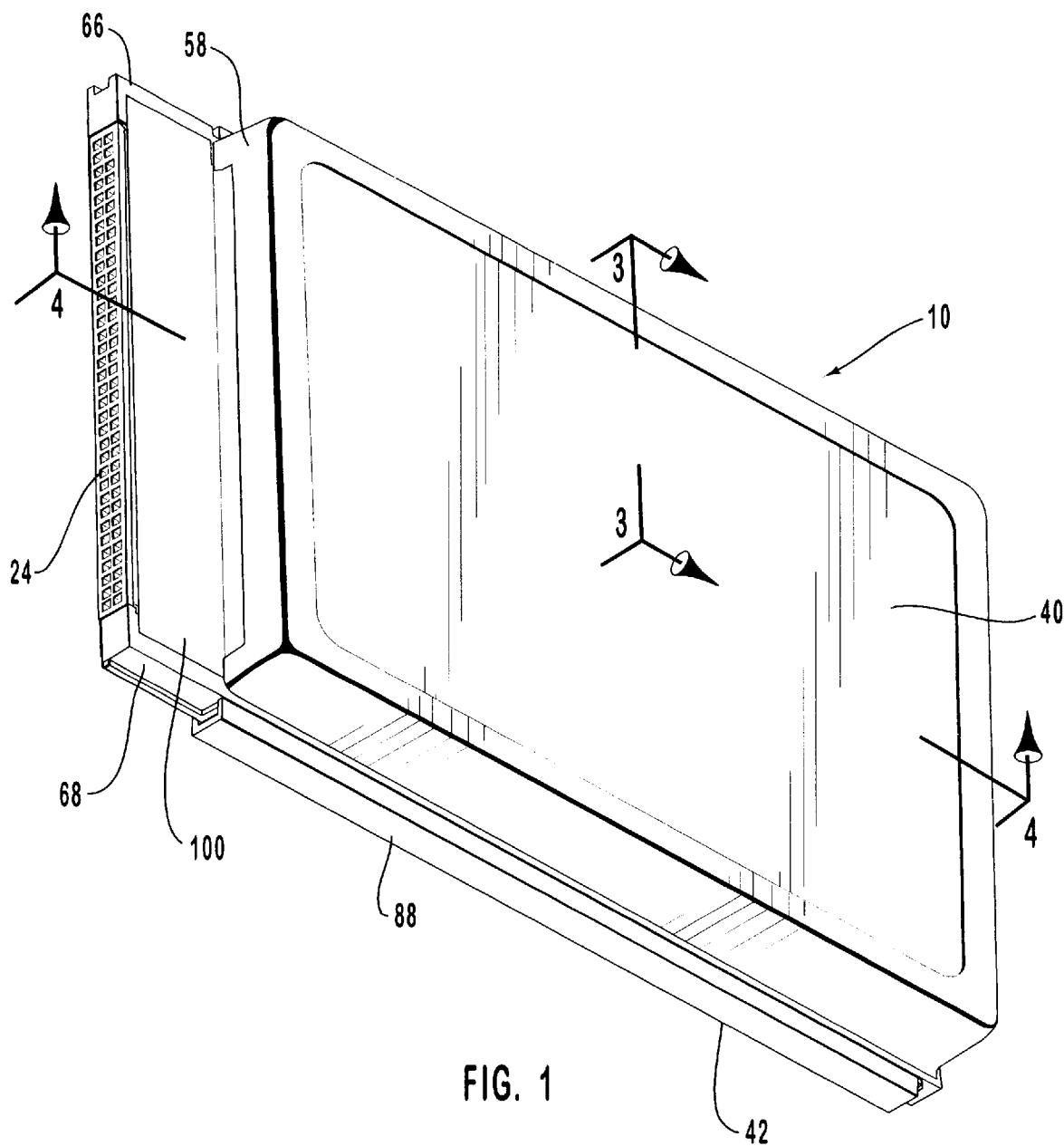
FIG. 1 is a perspective view of a PC card of the present invention.

Depicted in FIG. 1 is one embodiment of a PC card 10 incorporating features of the present invention. The term "PC card" as used in specification in appended claims, is broadly intended to include the various types of cards defined under the PCMCIA standard and cards outside of that standard. In preferred embodiment, PC card 10 conforms to the type III PCMCIA standards. Under this standard, PC card 10 has a width of 54 millimeters, a length of 85.6 millimeters and a substrate area thickness of 10.5 millimeters. Type III PC cards also require a card guide opening width of 51 millimeters of the header connector to accommodate the slightly raised substrate area.

Figure 2:
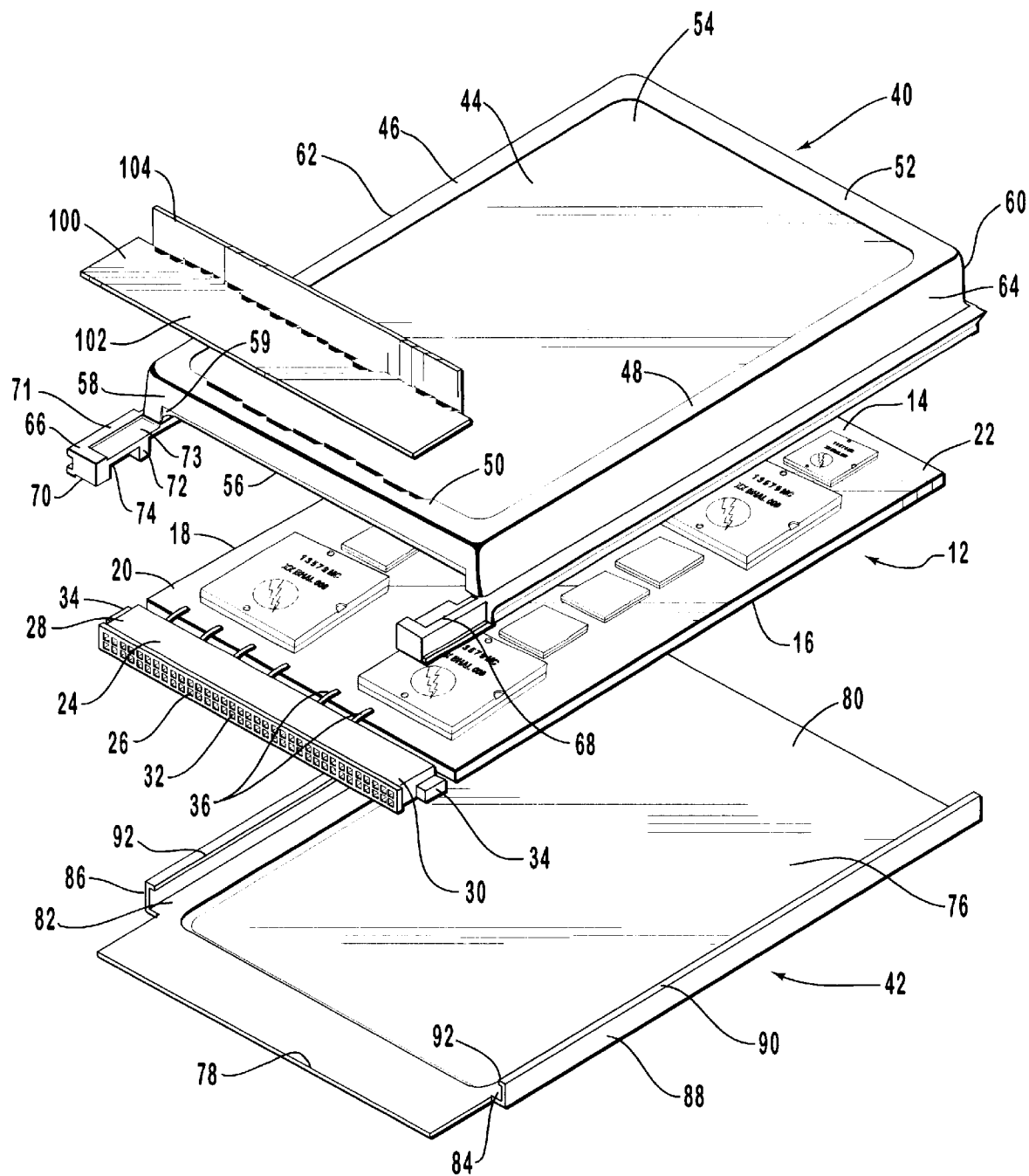
FIG. 2 is an exploded perspective view of the PC card shown in FIG. 1.

As depicted in FIG. 2, PC card 10 comprises a circuit board 12 having a top surface 14 and a bottom surface 16 each extending between a first end 20 and an opposing second end 22. Mounted on top surface 14 are plurality of discreet electronic components 18. Circuit board 12 can be configured to perform any of the functions of conventional PC cards. For example, circuit board 12 can be configured for either storing memory or for facilitating communication links over standard or wireless systems.

Electrically coupled to first end 20 of circuit board 12 is an I/O connector 24. I/O connector 24 preferably comprises a standard 68 pin edge receptacle although any I/O connector will equally function. As depicted in FIG. 2, connector 24 comprises a coupling face 26 extending between opposing ends 28 and 30. Formed or coupling face 26 are a plurality of pin slots 32. Projecting out from each of ends 28 and 30 is a retention knob 34. Connector 24 is electrically coupled to circuit board 12 by a plurality of contact fingers 36. Depending on the function of PC card 10, one or more I/O connectors can also be electrically coupled to second end 22 of circuit board 12.

Circuit board 12 is selectively enclosed by a top cover 40 and a base cover 42. Base cover 42 includes a substantially rectangular plate 76 having opposing ends 78 and 80 and opposing sides 82 and 84. Upstanding from each side 82 and 84 is a bottom sidewall 86 and 88, respectively. Each bottom sidewall 86 and 88 extends to a free end 90 where a locking ridge 92 inwardly projects along the length of base cover 42. Base cover 42 is comprised of metal and is preferably stamped from steel sheet metal having a thickness less than about 0.01 inches.

Top cover 40 comprises a substantially rectangular plate 44 having opposing sides 46 and 48 and opposing ends 50 and 52. Top cover 40 also has a top face 54 and an inside face 56. Projecting from each end 50 and 52 is an endwall 58 and 60, respectively. Endwall 58 has a recess 59 formed therein. Extending from each side 46 and 48 of plate 44 is a top sidewall 62 and 64, respectively.

Forwardly projecting from top sidewall 62 and 64 at endwall 58 are a pair of engagement brackets 66 and 68. Engagement bracket 66 is depicted as having a bottom surface 70, a top surface 71, and an inside face 72. A recess 73 is formed on top surface 71. Further, a notch 74 is formed in bottom surface 70 and extends through inside face 72. Engagement bracket 68 is the mirror image of engagement bracket 66. Accordingly, like structural elements between engagement bracket 66 and 68 are identified by like reference characters.

Figure 3:
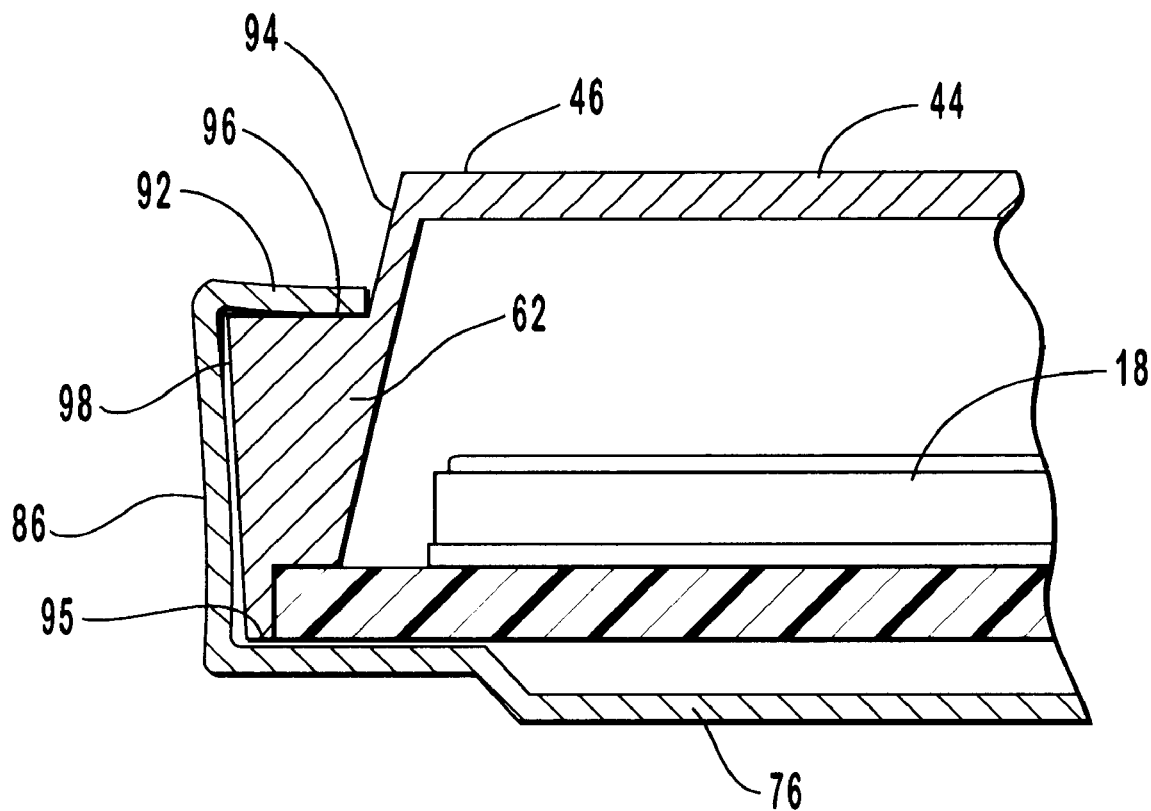
FIG. 3 is a cross-sectional side view of the PC card shown in FIG. 1 taken along section lines 3—3.

As depicted in FIG. 3, top sidewall 62 has an outside face 94 that extends from plate 44 to a free edge 95. An engagement shelf 96 projects from sidewall 62 therebetween. An outwardly sloping ramp 98 extends from edge 95 to shelf 96. Top sidewall 64 has the same configuration as top sidewall 62. Accordingly, corresponding structures between top sidewalls 62 and 64 will be identified by like reference characters.

One of the unique features of the present invention is that top cover 40 is comprised of a metal and has a minimum thickness in a range between about 0.04 to about 0.06 inches. Although top cover 40 can be formed from steel, preferred metals are those having a higher thermal conductivity, such as aluminum, magnesium, or composites thereof. The preferred manufacturing process is to die cast top cover 40. The increased thickness and high conductivity of top cover 40 assists in quickly drawing heat away from circuit board 12, thereby avoiding overheating of PC card 10.

During assembly, top cover 40 and base cover 42 are aligned with circuit board 12 disposed therebetween. Bottom sidewall 86 is positioned adjacent to outside face 94 of top sidewall 62. As top cover 40 and base cover 42 press together, locking ridge 92 of bottom sidewall 86 radially expands outward as it passes along and over ramp 98. Once past ramp 98, locking ridge 92 radially springs inward to mechanically bias on engagement shelf 96, as depicted in FIG. 3. In this configuration, top cover 40 and base cover 42 are mechanically locked together. In the preferred embodiment, locking ridge 92 is angled slightly toward plate 76 so as to produce a continual and positive bias against shelf 96.

In one embodiment of the present invention, means are provided for automatically mechanically locking the opposing sides of top cover 40 each to a corresponding one of the sides of base cover 42 when top cover 40 and base cover 42, having circuit board 12 disposed therebetween, are pressed together. By way of example and not by limitation, one embodiment of the means for automatically mechanically locking includes the configuration of top sidewalls 62 and 64 each having an engagement shelf 96 and bottom sidewalls 86 and 88 each having a locking ridge 92, as discussed above. Of course, there are a variety of alternative configurations that would work equally well. For example, engagement shelves 96 and locking ridges 92 could be switched or inverted.

One of the benefits of the depicted invention is that both locking ridge 92 and engagement shelf 96 extend substantially the full length of PC card 10. Since both top cover 40 and base cover 42 are metallic, this mechanical connection also provides an electrical coupling between top cover 40 and base cover 42 along the full length of PC card 10. Such coupling increases the grounding effectiveness of PC card 10 and helps to prevent electromagnetic leakage therefrom.

Returning to FIG. 2, as top cover 40 and base cover 42 are pressed together, retention knobs 34 on I/O connector 24 are received within corresponding notches 74 of engagement brackets 66 and 68. Connector 24 is thus securely held between engagement brackets 66 and 68 and base cover 40.

PC card 10 also includes a metallic L-shaped connector cover 100. Connector cover 100 includes a base plate 102 and a retention plate 104 upstanding from an edge thereof. During assembly the opposing ends of base plate 102 are received within a corresponding recess 73 of engagement brackets 66 and 68. Simultaneously, retention plate 104 is received within recess 59 on endwall 58. Cover 100 is comprised of a metallic material and is secured by an adhesive. Cover 100 preferably has a thickness less than about 0.01 inches and is disposed within recesses 73 so as to meet minimum thickness requirements at connector 24.

Connector cover 100 is not a necessary element and is used primarily to shield the top surface of I/O connector 24 so as to minimize electrostatic discharge therefrom. In alternative embodiments, connector cover 100 can comprise an adhesive backed, polycarbonate label where one side has been aluminized.

Figure 4:
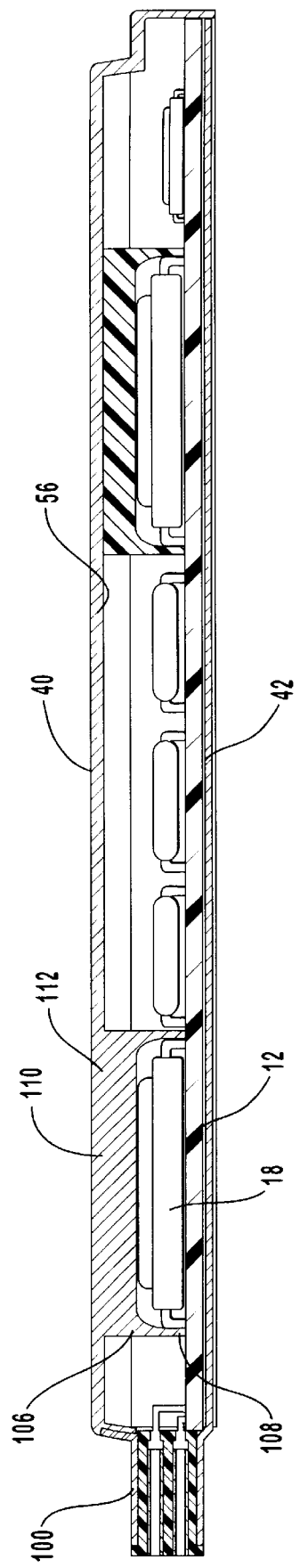
FIG. 4 is a cross-sectional side view of the PC card shows, in FIG. 1 taken along section lines 4—4.

The present invention also includes means formed on inside surface 56 of top cover 40 for encircling a component 18 so as to substantially block any electromagnetic interference emitted from component 18 when top cover 40 and base cover 42 are locked together. By way of example and not limitation, depicted in FIG. 4 is a shield wall 106 projecting from inside surface 56 and encircling component 18 when top cover 40 and base cover 42 are locked together. Shield wall 106 projects to a free end 108 that preferably contacts or is adjacently positioned to circuit board 12.

The present invention also includes means formed on inside surface 50 of top cover 40 for drawing heat away from component 18. By way of example and not limitation, also depicted in FIG. 4 is a heat sink 10 disposed within shield 106 and overlying component 18. In one embodiment, heat sink 110 comprises a solid metal plug 112, as shown in FIG. 4, that is integrally formed with top cover 40 in the same way that shield wall 106 is formed.

Figure 5:
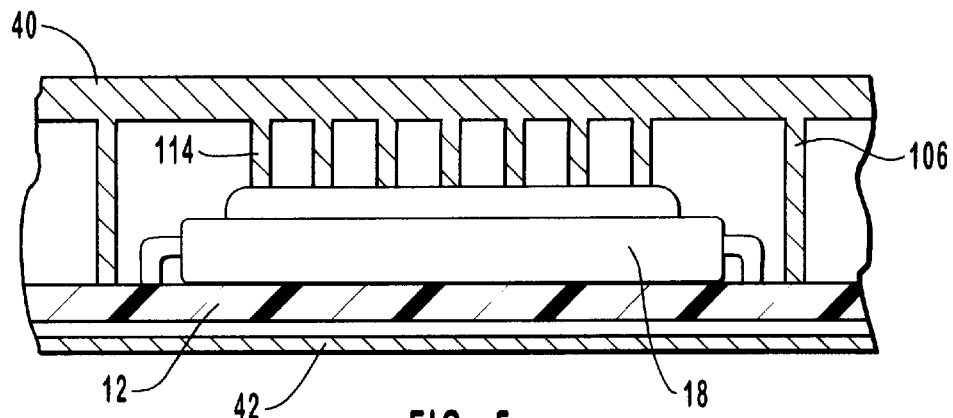
FIG. 5 is a cross-sectional side view of an alternative embodiment of a heat sink associated with a component of the circuit board as shown in FIG. 2.
Figure 6:
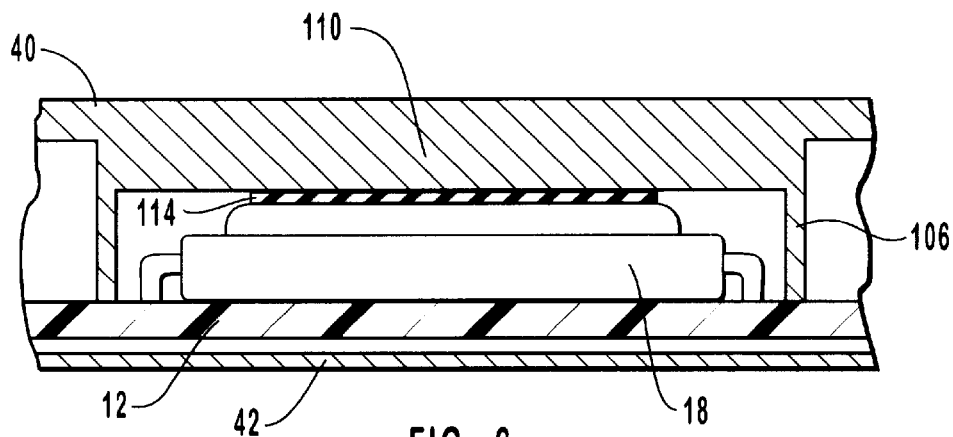
FIG. 6 is a cross-sectional side view of an alternative embodiment of a heat sink associated with a component of the circuit board shown in FIG. 2.
Figure 7:
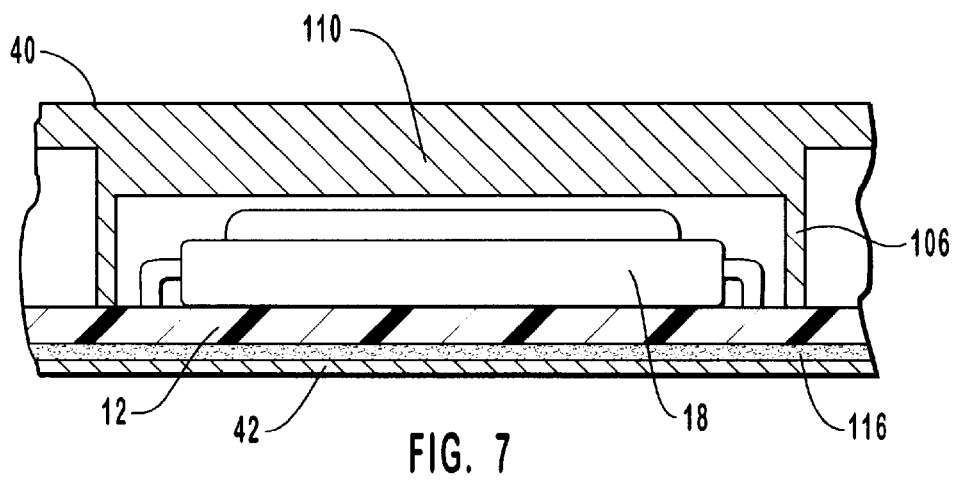
FIG. 7 is a cross-sectional side view of an alternative embodiment of the PC card shown in FIG. 3 having a foam layer positioned between the circuit board and the base cover.

In an alternative embodiment as depicted in FIG. 5, heat sink 110 can comprise a plurality of ribs 114 projecting from inside surface 50 towards component 18. It is preferred that ribs 114 or plug 112 contact or be adjacently disposed to component 18 for conducting heat therefrom. In another alternative embodiment as depicted in FIG. 6, a conventional thermal gasket 114 can be disposed between heat sink 110 and component 18. Thermal gasket 114 effects a cushioned direct contact between heat sink 110 and component 18.

In yet another embodiment of the present invention, a foam layer 116 can be disposed between circuit board 12 and base cover 42. Foam layer 116 resiliently pushes against circuit board 12 so as to bias heat sink 110 and shield wall 106 over component 18.

Top cover 40, shield wall 106, and heat sink 110 are preferably integrally die cast from the same metals as previously discussed with regard to top cover 40. By using a die cast process, shield wall 106 and heat sink 110 can be easily formed in a desired configuration and at a desired location relative to top cover 40 so as to fit over a desired electrical component.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A PC card comprising:
   (a) a top cover having a substantially rectangular configuration with opposing sides, the top cover being comprised of metal;
   (b) a base cover having a substantially rectangular configuration with opposing sides, the base cover being comprised of metal;
   (c) a circuit board positioned between the top cover and the base cover, the circuit board having a top surface with an electronic element positioned thereon;
   (d) an I/O connector electronically coupled to the circuit board;
   (e) means for automatically mechanically locking the opposing sides of the top cover each to a corresponding one of the sides of the base cover when the top cover and the base cover having the circuit board disposed therebetween are pressed together, the sides of the top cover and the base cover being locked in direct electrical contact through substantially the full height of the sides of the top cover and substantially the full height of the sides of the base cover so as to allow electrical current to pass therebetween along the full length of each side.

2. A PC card as recited in claim 1, wherein the means for automatically mechanically locking comprises:
   (a) a top sidewall projecting from each side of the top cover, each top sidewall having an outside face with an engagement shelf projecting therefrom; and
   (b) a base sidewall projecting from each side of the base cover, each base sidewall having an inside face with a locking ridge projecting therefrom.

3. A PC card as recited in claim 2, further comprising an engagement bracket projecting from each top sidewall at an end of the top cover.

4. A PC card as recited in claim 1, wherein the top cover is comprised of aluminum.

5. A PC card as recited in claim 1, further comprising the top cover having an inside surface with a shield wall projecting therefrom, the shield wall being configured to substantially encircle the component on the board when the top cover and base cover are locked together.

6. A PC card as recited in claim 1, further comprising the top cover having an inside surface with a heat sink projecting therefrom, the heat sink being positioned to overly the component on the board when the top cover and base cover are locked together.

7. A PC card as recited in claim 6, wherein the heat sink comprises a solid metal plug.

8. A PC card as recited in claim 1, wherein the top cover has opposing ends with an endwall projecting from each end.

9. A PC card as recited in claim 1, further comprising an L-shaped connector cover configured for attachment over the I/O connector when the top cover is attached to the base cover.

10. A PC card as recited in claim 1, further comprising:
 (a) the top cover having an inside surface;
 (b) a heat sink projecting from the inside surface; and
 (c) a shield wall projecting from the inside surface and encircling the heat sink, the shield being configured to substantially encircle the component on the board when the top cover and base cover are locked together.

11. A PC card as recited in claim 10, wherein the heat sink contacts the component when the top cover and base cover are locked together.

12. A PC card as recited in claim 10, further comprising a heat gasket extending between the component and the heat sink.

13. A PC card as recited in claim 10, wherein the heat sink comprises a plurality of metal fins.

14. A PC card comprising:
 (a) a circuit board;
 (b) an I/O connector electronically coupled to the circuit board;
 (c) a metallic top cover comprising a substantially rectangular plate with a pair of opposing top sidewalls projecting therefrom at substantially right angles, each top sidewall having an outside face with an engagement shelf projecting therefrom substantially along the length of the top cover; and
 (d) a metallic base cover comprising a substantially rectangular plate with a pair of opposing base sidewalls projecting therefrom at substantially right angles, each base sidewall having an inside face with a locking ridge projecting therefrom substantially along the length of the base cover, each locking ridge being configured to resiliently bias against a corresponding engagement shelf, thereby mechanically locking the top cover to the base cover, and providing direct electrical contact between the inside face of the base cover and the outside face of the top cover through substantially the full height of the inside face of the base cover and substantially the full height of the outside face of the top cover when the top cover and base cover having the circuit board positioned therebetween are pressed together.

15. A PC card as recited in claim 14, wherein each top sidewall comprises a sloped ramp positioned adjacent to the engagement shelf.

16. A PC card as recited in claim 14, wherein the top cover is cast from aluminum.

17. A PC card as recited in claim 14, wherein the top cover has a thickness in a range between about 0.04 and about 0.06 inches.

18. A PC card comprising:
 (a) a circuit board having a top surface with an electronic component mounted thereon and an opposing bottom surface;
 (b) an I/O connector electronically coupled to the circuit board;
 (c) a metallic top cover having an inside surface extending between opposing sides, the inside face being positioned over the top surface of the circuit board;
 (d) a metallic base cover having an inside surface extending between opposing sides, the inside surface being positioned over the bottom surface of the circuit board;
 (e) means for automatically mechanically locking the opposing sides of the top cover each to a corresponding one of the sides of the base cover when the top cover and the base cover are pressed together, the means comprising a top sidewall projecting from each side of the top cover, each top sidewall having an outside face with an engagement shelf projecting therefrom, and a base sidewall projecting from each side of the base cover, each base sidewall having an inside face with a locking ridge projecting therefrom, the outside face of the top sidewall and the inside face of the base sidewall forming a direct electrical contact between the inside face of the base sidewall and the outside face of the top sidewall through substantially the full height of the inside face of the base sidewall and substantially the full height of the outside face of the top sidewall when the top cover and base cover having the circuit board positioned therebetween are pressed together; and
 (f) means formed on the inside surface of the top cover for encircling the component so as to substantially block any electromagnetic interference emitted from the component when the top cover and the base cover are locked together.

19. A PC card as recited in claim 18, wherein the means formed on the inside surface of the top cover for encircling the component comprises the inside surface of the top cover having a shield wall projecting therefrom, the shield wall being configured to substantially encircle the component on the board when the top cover and base cover are locked together.

20. A PC card comprising:
 (a) a circuit board having a top surface with an electronic component mounted thereon and an opposing bottom surface;
 (b) a pin connector electronically coupled to the circuit board;
 (c) a metallic top cover having an inside surface extending between opposing sides, the inside face being positioned over the top surface of the circuit board;
 (d) a metallic base cover having an inside surface extending between opposing sides, the inside surface being positioned over the bottom surface of the circuit board;
 (e) means for automatically mechanically locking the opposing sides of the top cover each to a corresponding one of the sides of the base cover when the top cover and the base cover are pressed together, the means comprising a top sidewall projecting from each side of the top cover, each top sidewall having an outside face with an engagement shelf projecting therefrom, and a base sidewall projecting from each side of the base cover, each base sidewall having an inside face with a locking ridge projecting therefrom, the outside face of the top sidewall and the inside face of the base sidewall forming a direct electrical contact between the inside face of the base sidewall and the outside face of the top sidewall through substantially the full height of the inside face of the base sidewall and substantially the full height of the outside face of the top sidewall when the top cover and base cover having the circuit board positioned therebetween are pressed together; and (f) means formed on the inside surface of the top cover for drawing heat away from the component on the circuit board.

21. A PC card as recited in claim 20, wherein the means formed on the inside surface of the top cover for drawing heat away from the component on the circuit board comprises a heat sink projecting from the inside surface of the top cover, the heat sink being positioned to overly the component on the board when the top cover and base cover are locked together.

22. A PC card as recited in claim 20, further comprising a foam cushion layer positioned between the circuit board and the base cover.

* * * * *